United States Patent
Epp et al.

(10) Patent No.: US 11,066,327 B2
(45) Date of Patent: Jul. 20, 2021

(54) VACUUM COMPATIBLE ELECTRICAL INSULATOR

(71) Applicant: GENERAL FUSION INC., Burnaby (CA)

(72) Inventors: Kelly Bernard Epp, Langely (CA); Michel Georges Laberge, West Vancouver (CA)

(73) Assignee: General Fusion Inc., British Columbia (CA)

( * ) Notice: Subject to any disclaimer, the term of this patent is extended or adjusted under 35 U.S.C. 154(b) by 0 days.

(21) Appl. No.: 16/634,115

(22) PCT Filed: May 22, 2018

(86) PCT No.: PCT/CA2018/050595
§ 371 (c)(1),
(2) Date: Jan. 24, 2020

(87) PCT Pub. No.: WO2018/232495
PCT Pub. Date: Dec. 27, 2018

(65) Prior Publication Data
US 2020/0231492 A1    Jul. 23, 2020

Related U.S. Application Data

(60) Provisional application No. 62/522,268, filed on Jun. 20, 2017.

(51) Int. Cl.
*C03C 17/23* (2006.01)
*H01B 3/08* (2006.01)
(Continued)

(52) U.S. Cl.
CPC .............. *C03C 17/23* (2013.01); *H01B 3/08* (2013.01); *H01B 3/12* (2013.01); *H05H 1/24* (2013.01);
(Continued)

(58) Field of Classification Search
None
See application file for complete search history.

(56) References Cited

U.S. PATENT DOCUMENTS 2,974,051 A * 3/1961 Moore .................. C23C 24/103
501/19
5,053,283 A * 10/1991 Brown ..................... H01B 1/22
428/432

(Continued)

FOREIGN PATENT DOCUMENTS

CN       1276908 A       12/2000
JP       1994-065739     3/1994
KR       20110037282     4/2011

OTHER PUBLICATIONS

International Search Report and Written Opinion, International Application No. PCT/CA2018/050595, dated Jul. 19, 2018 in 7 pages.

(Continued)

*Primary Examiner* — Amy Cohen Johnson
*Assistant Examiner* — Srinivas Sathiraju
(74) *Attorney, Agent, or Firm* — Knobbe, Martens, Olson & Bear, LLP

(57) ABSTRACT

Examples of a high voltage insulator are described. The high-voltage insulator is vacuum compatible and comprises a glass substrate having a face surface and a ceramic layer with uniform thickness coated on the face surface of 5 the glass substrate. The coated surface of the insulator is able to withstand high voltage pulses and exposure to charged particles radiation for a pre-determined time period. The ceramic coated glass insulator is made of a single piece of glass and can be made to large sizes.

19 Claims, 3 Drawing Sheets

(51) Int. Cl.
  *H01B 3/12* (2006.01)
  *H05H 1/24* (2006.01)
(52) U.S. Cl.
  CPC .. *C03C 2217/214* (2013.01); *C03C 2217/228* (2013.01)

(56) References Cited

U.S. PATENT DOCUMENTS

| | | | | |
|---|---|---|---|---|
| 5,119,063 | A * | 6/1992 | Nonnenmacher | .... H01C 10/305 338/159 |
| 5,316,739 | A | 5/1994 | Yoshikawa et al. | |
| 6,702,975 | B1 | 3/2004 | Windmar et al. | |
| 7,176,528 | B2 * | 2/2007 | Couillard | ............ H01L 21/2007 257/347 |
| 2004/0229444 | A1 * | 11/2004 | Couillard | .......... H01L 21/76254 438/455 |
| 2006/0147699 | A1 * | 7/2006 | Sarkar | ................... C04B 35/119 428/323 |
| 2008/0029032 | A1 * | 2/2008 | Sun | ........................ H02N 13/00 118/728 |
| 2010/0221489 | A1 * | 9/2010 | Lappalainen | ...... B23K 26/0821 428/141 |
| 2012/0009355 | A1 * | 1/2012 | Gasworth | ........... C23C 16/4404 427/569 |
| 2020/0090866 | A1 * | 3/2020 | O'Connor | ................ H01G 4/10 |
| 2020/0231492 | A1 * | 7/2020 | Epp | ........................ C03C 17/23 |

OTHER PUBLICATIONS

Majumdar, et al., "Glass and glass-ceramic coatings, versatile materials for industrial and engineering applications", Bull. Mater. Sci., vol. 24, No. 1, Feb. 2001, pp. 69-77.

R. Messler Jr., Chapter 9 entitled "Ceramic and Glass Attachment Schemes and Attachments," of "Integral Mechanical Attachment," ISBN 978-0-7506-7965-7, pp. 239-277, (2009).

KR 10-2020-7001406 Non-Final Office Action dated Apr. 27, 2020 in 7 pages.

KR 10-2020-7001406 Final Office Action dated Aug. 26, 2020 in 5 pages.

* cited by examiner

US 11,066,327 B2

VACUUM COMPATIBLE ELECTRICAL INSULATOR

CROSS-REFERENCE TO RELATED APPLICATIONS

This application is the U.S. National Phase under 35 U.S.C. § 371 of International Application No. PCT/CA2018/050595, filed May 22, 2018, designating the United States and published in English on Dec. 27, 2018 as WO2018/232495, and which claims priority to U.S. Provisional Appl. No. 62/522,268, filed Jun. 20, 2017.

TECHNICAL FIELD

The present disclosure generally relates to a vacuum compatible electrical insulator.

BACKGROUND

Electrical insulators are well known in the art. Electrical insulators are used in electrical equipment to support and separate electrical conductors without allowing current flow through the insulator itself. All electrical insulators become electrically conductive when a sufficiently large voltage is applied and the electric field tears electrons away from the atoms of the insulator (known as "breakdown voltage" of the insulator). An electrical insulator is typically used in high energy plasma systems, charged particle accelerators or high-voltage generators. In some applications, electrical insulators need to be vacuum compatible (e.g. when installed as part of a vacuum vessel), such as the electrical insulators must hold a voltage across the insulator's surface without breaking down while maintaining vacuum conditions. Electrical insulators used in a vacuum are prone to breakdown across surfaces of the insulator at voltages which are much lower than the voltages required to cause breakdown through the material itself when in an air atmosphere. In addition, for some applications (e.g. plasma systems), the electrical insulator needs to withstand exposure to high energy ionized plasma that may contact the surface of the insulator, without damaging such surface.

The most common materials for vacuum compatible electrical insulators are ceramics, such as alumina ($Al_2O_3$). Alumina used as an insulator is vacuum compatible and can sustain voltages across its surface without breakdown; however, manufacturing a large size ceramic insulator can be challenging. The largest known commercially available alumina insulator is about 1 meter in diameter. The problem with making large alumina components is that it can fracture easily during the manufacturing process. As a result, the manufacture of large size alumina insulators is a complex and expensive process. Some known solutions for providing a large size alumina insulator include using multiple small alumina tiles in place of one large insulator, but this adds additional complexity to the installment of the insulator and can compromise the vacuum quality.

Another common electrical insulator material is glass ($SiO_2$). Glass can be made to very large sizes and is a good electrical insulator; however, it is easily damaged by exposure to charged particles (e.g. plasma) and under vacuum the charge buildup along the glass surface may trigger a surface flashover due to high surface resistivity of the glass. The charged particles can damage the glass surface and cause the insulator to fail and/or significantly reduce the hold-off voltage that needs to be maintained across the insulator's surface.

Plastic is also often used as an electrical insulator material. Plastic electrical insulators can be made to very large size, but are not compatible with vacuum applications (outgassing is too high) and are easily broken down with exposure to charged particles.

SUMMARY

In one aspect, a vacuum compatible electrical insulator is provided. The vacuum compatible electrical insulator comprises a glass substrate having at least one face surface with at least a portion exposable to high energy charged particles or photons, and a ceramic layer coating the at least one portion of the at least one face surface of the glass substrate.

In one aspect, the glass substrate is a single piece of glass that is circular and has a diameter of at least 1 m.

In one aspect, the glass substrate is composed of borosilicate glass. The ceramic layer can be composed of a material selected from a group consisting of yttria and alumina.

In another aspect, a plasma system is provided. The plasma system comprises a vacuum vessel, a first electrode and a second electrode mount in the vacuum vessel and spaced apart to form a gap therein between such that a voltage can be applied between the first and the second electrodes and an electrical insulator mounted between the two electrodes. The electrical insulator comprises a glass substrate with at least one face surface with at least a portion exposable to plasma inside the vacuum vessel and a ceramic layer coating the at least one portion of the at least one face surface.

In addition to the aspects and embodiments described above, further aspects and embodiments will become apparent by reference to the drawings and study of the following detailed description.

BRIEF DESCRIPTION OF THE DRAWINGS

Throughout the drawings, reference numbers may be re-used to indicate correspondence between referenced elements. The drawings are provided to illustrate example embodiments described herein and are not intended to limit the scope of the disclosure. Sizes and relative positions of elements in the drawings are not necessarily drawn to scale. For example, the shapes of various elements and angles are not drawn to scale, and some of these elements are arbitrarily enlarged and positioned to improve drawing legibility.

FIG. 3b shows a close up of the coating of the electrical insulator of FIG. 3a.

DETAILED DESCRIPTION OF SPECIFIC EMBODIMENTS

Embodiments of the invention described herein relate to an electrical insulator suitable for use in large size and vacuum applications. In some embodiments, the electrical insulator is suitable for use in plasma generating systems and particles accelerators, wherein the insulator is placed in a gap between the electrodes. In some embodiments, the electrical insulator may have a diameter of about ~2 meters or larger. The largest commercially available ceramic (e.g. alumina) insulator is about 1 meter in diameter and the cost for manufacturing such large alumina insulators is several hundred thousand dollars per piece. In contrast, it is expected that embodiments of the electrical insulator are simpler and less expensive to manufacture.

Embodiments of the electrical insulator disclosed herein can be installed in a vacuum vessel, are designed to be quite large (not limited by size) and are able to withstand exposure to high energy charged particles, such as plasma.

Embodiments of the invention are described herein in use with respect to a plasma generation system. However, one skilled in the art will recognize that other embodiments of the invention may be used in other applications, for instance, x-ray systems, electron tubes, beam injectors, particle accelerators or other devices that require electrical insulators. The discussion of the plasma generation system herein below is merely an example of one such implementation and is not intended to be limiting in terms of modality. Persons skilled in the art would understand that the invention is applicable for other systems that require installation of an electrical insulator that operates under vacuum.

Figure 1:
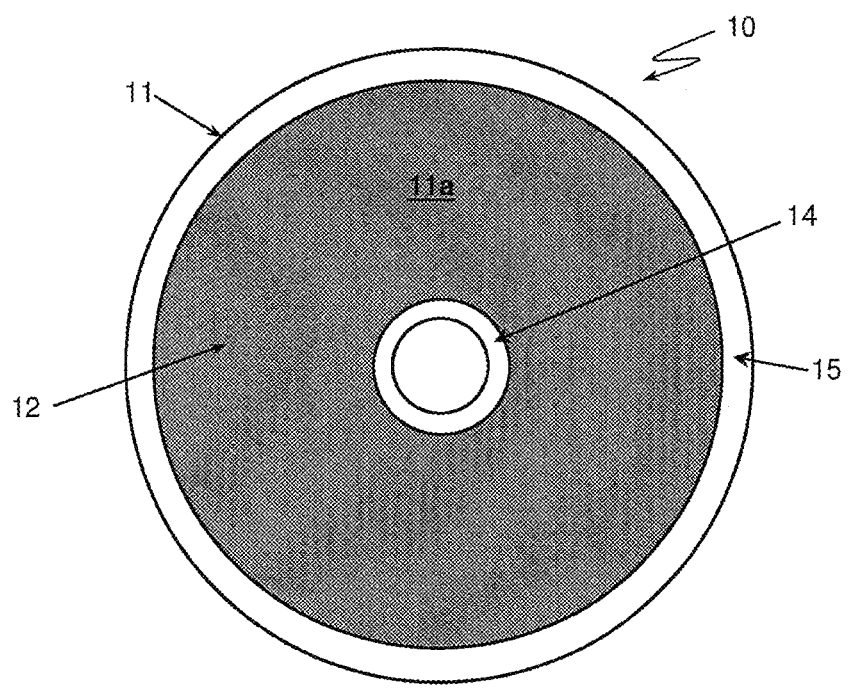
FIG. 1 is a schematic top view of an example of a high-voltage, vacuum compatible, ceramic coated glass electrical insulator.

FIG. 1 illustrates an example of an electrical insulator 10 that comprises a glass ($SiO_2$) substrate 11 and a ceramic coating layer 12. The glass substrate 11 comprises a body that can act as a vacuum seal between the high vacuum and the external atmosphere. In some implementations, the glass substrate 11 can be composed of a borosilicate glass. The glass substrate 11 can be cut out of a single piece of glass and can have a pre-determined desired size and shape. For example, the illustrated example of the glass substrate 11 has a ring shape (e.g. a disk). The glass substrate 11 has at least one face surface 11a that is coated with the ceramic layer 12. The face surface 11a is a surface of the insulator that is exposed to the high energy charged particles. The ceramic coating layer 12 is configured to protect the glass substrate 11 from being damaged by high energy charged particles or photons while still holding the voltages under vacuum. The ceramic coating 12 is applied to the face surface 11a and it should be thick enough to sustain the voltages and the exposure to charged particles in order to protect the glass substrate 11. In some embodiments, the ceramic coating layer 12 can be 10 μm-200 μm thick coating the face surface 11a. However, persons skilled in the art would understand that the ceramic coating layer can be a different thickness in other embodiments. Any suitable coating process can be used to apply the coating layer 12. For example, the ceramic coating layer 12 can be applied to the glass substrate 11 using a plasma spray deposition, vapor deposition or any other suitable deposition process that can be used to apply a ceramic coating on a glass substrate. The coating layer 12 can be, for example, an alumina ($Al_2O_3$) or any other ceramic material known to be suitable for use in vacuum and plasma environments. In one implementation, the coating layer 12 can be yttria (yttrium (III) oxide $Y_2O_3$. The glass substrate can have a cylindrical, rectangular, tubular or any other desired shape or combination thereof. In one embodiment, the surface of the glass substrate 11 can comprises a number of folds to compensate for difference between the coefficient of thermal expansion of the glass substrate 11 (e.g. borosilicate glass) and the coefficient of thermal expansion of the ceramic coating 12 (e.g. alumina, yttria).

In the illustrated example of the insulator 10, the ceramic coating 12 is applied only on one side of the substrate 11, because only one side of the insulator faces and is exposed to the vacuum/plasma; however person skilled in the art would understand that both sides (and/or edges) of the insulator 10 can be coated with the ceramic layer 12 without departing from the scope of the invention. The face surface 11a can be a continuous single surface or comprise multiple surface portions. For example, the face surface 11a can comprise multiple surface portions when the insulator 10 is used in applications where only parts of the insulator 10 is exposed to high energy changed particles; in such applications, two or more coated face surface portions 11a are interspersed with one or more uncoated surface portions (not shown). The electrical insulator 10, illustrated in FIG. 1, can have an uncoated region 14 around an inner diameter and an uncoated region 15 around an outer circumference of the electrical insulator 10. The uncoated regions 14 and 15 can be used as seats for seal(s), such as for example O-ring seals, that can be mounted against the uncoated glass regions 14, 15, so that the electrical insulator 10 can form a vacuum seal and an electrically insulating barrier between the two conductors. The ceramic coating layer 12 maintains the electrically insulating barrier between the electrodes and withstands exposure to the high energy ionized plasma. For example, the alumina coating layer 12 protects the glass substrate 11 from being damaged by the plasma and it maintains its electrically insulating properties when it is exposed to the plasma. The vacuum seal could also be made through a metal interface ring that is bonded to the glass. The uncoated glass regions could be metallized using any standard method to deposit metal on to a glass substrate. The metallized region of the glass could then be leak tight bonded to a suitable low thermal expansion metal (such as for example Invar).

Figure 2:
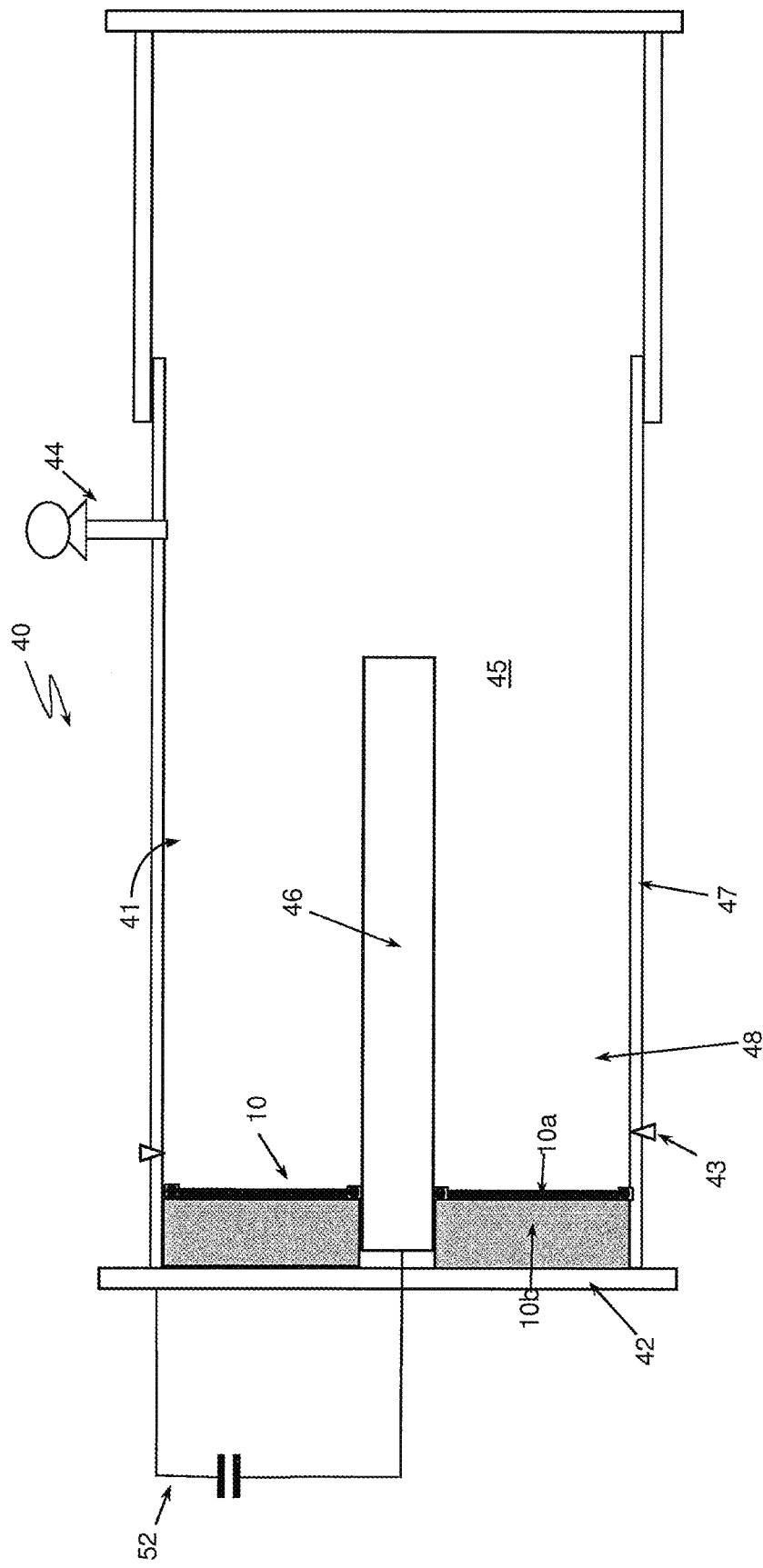
FIG. 2 is a schematic cross-sectional view of a plasma generator with the ceramic coated glass electrical insulator installed in a gap between an inner electrode and an outer electrode.

FIG. 2 illustrates a schematic of an example of a plasma system 40 using the ceramic coated glass electrical insulator 10. The plasma generation system 40 is configured to generate plasma and it comprises a plasma generation vessel 41 with a first 46 and a second electrode 47. The plasma system 40 is evacuated using a pumping system 44. The ceramic coated glass electrical insulator 10 is mounted in proximity to a close end 42 of the vessel 41, such that a face surface 10a of a glass substrate 10b faces the inner cavity 45. The face surface 10a is coated with a ceramic layer (e.g. alumina), so that the alumina layer covers the face surface 10a of the glass substrate 10b. A number of gas valves 43 can be used to symmetrically inject a precise quantity of gas into an annular gap 48 formed between the electrodes 46 and 47. The plasma system 40 can further comprise a power source 52 configured to provide a discharge pulse to the first electrode 46 so that a current flows across the gap 48 between the electrodes 46 and 47, ionizing the gas and forming plasma. The electrical insulator 10 separates the electrodes 46 and 47 and forms an electrically insulating barrier therein between. The electrical insulator 10 illustrated in FIG. 2 has a disk (ring) shape with diameter of 1 m or larger. The electrical insulator 10 can have other shapes depending on the position and relationship of the two electrodes.

EXAMPLE

The ceramic coated glass electrical insulator has been tested in a number of plasma systems at General Fusion Inc. The ceramic coated glass electrical insulator was installed between an inner electrode and a ground potential electrode.

Figure 3A:
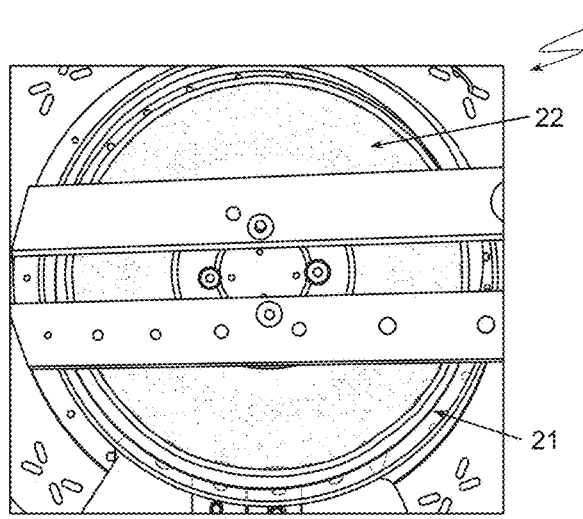
FIG. 3a shows an experimental ceramic coated glass electrical insulator after being tested under high voltage, high vacuum and plasma exposure.
Figure 3B:
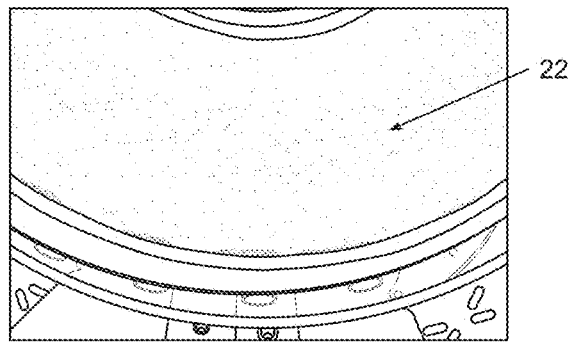
Figure 4:
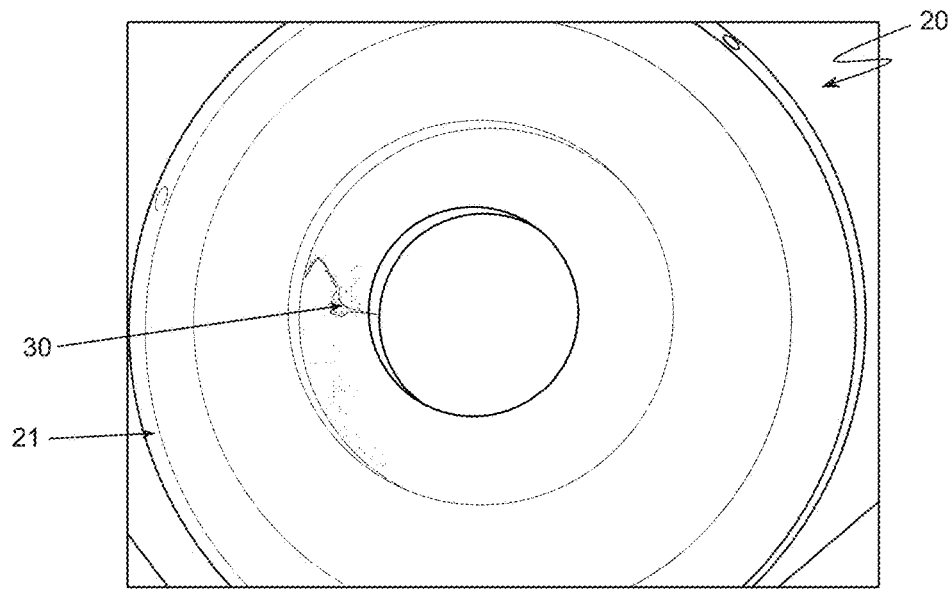
FIG. 4 shows a bare glass side of an uncoated electrical insulator after being tested under high voltage, high vacuum and plasma exposure.

The ceramic coated glass electrical insulator 20 comprised an annular disc-shaped glass substrate 21 composed of borosilicate glass and having an outer diameter of 14 inches (35.56 cm), an inner diameter of 4" (~10.16 cm) and a thickness of 0.75" (~1.9 cm). The ceramic layer 22 of coating the glass substrate was composed of alumina, had a thickness of about 100 μm and was applied on the glass substrate 21 by a plasma spray method. A vacuum vessel was used as the ground potential electrode for the plasma discharge. O-ring seals were used to seal the vacuum vessel. A voltage of about 20 kV was applied across the ceramic-coated glass electrical insulator 20 for 50-100 μs per pulse for hundreds of pulses. The ceramic-coated glass electrical insulator 20 was further exposed to plasma that was generated between the electrodes. The same test was conducted using an uncoated (bare) glass insulator (see FIG. 4) having the same composition and dimensions as the glass substrate 21 of the ceramic coated glass electrical insulator. Results are shown in FIGS. 3 and 4. The tests with the ceramic coated glass electrical insulator (FIGS. 3a, 3b) show a slight discoloration on the coating 22 (most probably contamination from the vacuum chamber); however, no significant damage of the electrical insulator's surface occurred and the electrical insulator 20 withstood the voltage pulses and the plasma exposure. The contamination did not stop the coating 22 from maintaining its electrically insulating properties. The results show that the ceramic coated glass electrical insulator 20 performs as well as any solid ceramic electrical insulator when exposed to plasma discharges; however the cost for manufacturing a big ceramic coated glass insulator is expected to be much lower than manufacturing a large solid ceramic (alumina) insulator.

In the tests conducted with an uncoated glass electrical insulator (see FIG. 4), where the uncoated side of the electrical insulator 20 was facing the vacuum and the plasma environment, the exposure to the plasma has caused surface cracking which reduced the ability of the uncoated glass electrical insulator to hold off the voltage between the electrodes, resulting in cracks 30 in the bulk material and leading to a vacuum leak through the uncoated glass electrical insulator.

The coating was also applied to a glass substrate shaped as an elongated rod and tested. One electrode was clamped on one end of the coated glass rod and the other electrode was clamped on the opposite end of the glass rod. The assembly of the electrodes with the insulator between the electrodes was put in a vacuum chamber and a voltage (~30 kV) was applied between the electrodes. A helium gas was injected into the vacuum chamber to initiate a breakdown between the electrodes and to generate plasma. The ceramic coating was applied around the circumference of the glass rod forming a coating layer on the face surface of the insulator. In the tests conducted with the coated glass rod insulators, the insulators were able to withstand repeated breakdowns without significant damage or loss of ability to hold off voltage.

While particular elements, embodiments and applications of the present disclosure have been shown and described, it will be understood, that the scope of the disclosure is not limited thereto, since modifications can be made by those skilled in the art without departing from the scope of the present disclosure, particularly in light of the foregoing teachings. Thus, for example, in any method or process disclosed herein, the acts or operations making up the method/process may be performed in any suitable sequence and are not necessarily limited to any particular disclosed sequence. Elements and components can be configured or arranged differently, combined, and/or eliminated in various embodiments. The various features and processes described above may be used independently of one another, or may be combined in various ways. All possible combinations and subcombinations are intended to fall within the scope of this disclosure. Reference throughout this disclosure to "some embodiments," "an embodiment," or the like, means that a particular feature, structure, step, process, or characteristic described in connection with the embodiment is included in at least one embodiment. Thus, appearances of the phrases "in some embodiments," "in an embodiment," or the like, throughout this disclosure are not necessarily all referring to the same embodiment and may refer to one or more of the same or different embodiments. Indeed, the novel methods and systems described herein may be embodied in a variety of other forms; furthermore, various omissions, additions, substitutions, equivalents, rearrangements, and changes in the form of the embodiments described herein may be made without departing from the spirit of the inventions described herein.

Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without operator input or prompting, whether these features, elements and/or steps are included or are to be performed in any particular embodiment. No single feature or group of features is required for or indispensable to any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. The example calculations, simulations, results, graphs, values, and parameters of the embodiments described herein are intended to illustrate and not to limit the disclosed embodiments. Other embodiments can be configured and/or operated differently than the illustrative examples described herein.

What is claimed is:

1. A vacuum compatible electrical insulator configured to be exposed to an ionized plasma, the electrical insulator comprising:
   an electrically insulating glass substrate having at least one face surface; and
   an electrically insulating ceramic layer coating at least a portion of the at least one face surface of the glass substrate, the electrically insulating ceramic layer configured to be exposed to the ionized plasma and to protect the portion of the at least one face surface from the ionized plasma.

2. The electrical insulator of claim 1, wherein the glass substrate comprises a single piece of glass.

3. The electrical insulator of claim 2, wherein the glass substrate is circular and has a diameter of at least 1 m.

4. The electrical insulator of claim 3, wherein the glass substrate is an annular disk with a central opening for receiving an electrode, and further comprising an uncoated inner region of the glass substrate circumscribing the central opening, and an uncoated outer region of the glass substrate circumscribing an outer circumference thereof.

5. The electrical insulator of claim 4 further comprising inner and outer fluid seals seated on the uncoated inner region and uncoated outer region, respectively.

6. The electrical insulator of claim 1, wherein the glass substrate is composed of borosilicate glass.

7. The electrical insulator of claim 1, wherein the ceramic layer is composed of a material selected from a group consisting of yttria and alumina.

8. The electrical insulator of claim 7, wherein the thickness of the alumina ceramic layer is between 10 μm -200 μm.

9. The electrical insulator as claimed in claim 1 wherein the at least one face surface comprises multiple portions coated with the ceramic layer, and interspersed by at least one uncoated portion.

10. The electrical insulator as claimed in claim 1, wherein the at least one face surface of the glass substrate comprises folds, the folds being sized and configured to compensate for a difference between a coefficient of thermal expansion of the glass substrate and a coefficient of thermal expansion of the ceramic layer.

11. A plasma system comprising:
a vacuum vessel;
a first electrode and a second electrode mounted in the vacuum vessel and spaced apart to form a gap therebetween, the first and second electrodes operable to apply a voltage between the first and the second electrodes; and
an electrical insulator mounted between the two electrodes, the electrical insulator comprising an electrically insulating glass substrate with at least one face surface, and an electrically insulating ceramic layer coating at least a portion of the at least one face surface, the ceramic layer configured to be exposed to plasma inside the vacuum vessel and to protect the portion of the at least one face surface from the plasma.

12. The plasma system of claim 11, wherein the glass substrate comprises a single piece of glass.

13. The plasma system of claim 11, wherein the glass substrate is circular and has a diameter of at least 1 m.

14. The plasma system of claim 13, wherein the glass substrate is an annular disk with a central opening for receiving the first electrode, and further comprising an uncoated inner region of the glass substrate circumscribing the central opening, and an uncoated outer region of the glass substrate circumscribing an outer circumference thereof.

15. The plasma system of claim 14 wherein the second electrode is tubular and surrounds the electrical insulator, and the electrical insulator further comprises inner and outer seals seated on the uncoated inner region and uncoated outer region, respectively, such that fluid seals are established between the electrical insulator and the first and second electrodes.

16. The plasma system of claim 11, wherein the glass substrate is composed of borosilicate glass.

17. The plasma system of claim 11, wherein the ceramic layer is composed of a material selected from a group consisting of yttria and alumina.

18. The plasma system of claim 17, wherein the thickness of the alumina ceramic layer is between 10 μm -200 μm.

19. The plasma system as claimed in claim 11 wherein the at least one face surface comprises multiple portions coated with the ceramic layer and interspersed by at least one uncoated portion.

* * * * *